United States Patent [19]

Donoghue

[11] Patent Number: 4,563,753

[45] Date of Patent: Jan. 7, 1986

[54] CIRCUIT FOR REDUCING DEGRADATION OF VOLTAGE DIFFERENTIAL IN A MEMORY

[75] Inventor: William J. Donoghue, Round Rock, Tex.

[73] Assignee: Motorola, Inc., Schaumburg, Ill.

[21] Appl. No.: 646,725

[22] Filed: Sep. 4, 1984

[51] Int. Cl.[4] .............................................. G11C 11/40
[52] U.S. Cl. ................................... 365/104; 365/168; 365/203
[58] Field of Search ............... 365/104, 149, 168, 182, 365/203, 189

[56] References Cited

U.S. PATENT DOCUMENTS 4,460,981  7/1984  Van Buskirk et al. .............. 365/190

Primary Examiner—James W. Moffitt
Attorney, Agent, or Firm—Anthony Sarli, Jr.; Jeffrey Van Myers; James L. Clingan, Jr.

[57] ABSTRACT

A virtual ground memory which has four state cells coupled to bit lines has a load directly connected to each bit line to reduce the degradation of the output of a selected memory cell due to voltage drop caused by current flow between load and selected memory cell. Additionally, loads which are coupled to the bit lines are also coupled to an adjacent virtual ground line to avoid providing a separate power supply line for the loads.

6 Claims, 2 Drawing Figures

CIRCUIT FOR REDUCING DEGRADATION OF VOLTAGE DIFFERENTIAL IN A MEMORY

CROSS-REFERENCE TO RELATED APPLICATIONS

Related subject matter is disclosed in U.S. patent application Ser. No. 646,718, filed Sept. 4, 1984, entitled "Circuit For Equalizing Bit Lines In A ROM", filed simultaneously herewith, and assigned to the assignee hereof.

FIELD OF THE INVENTION

The invention relates to memory circuits, and more particularly to memory circuits which sense a voltage differential for determining a state of a selected memory cell.

BACKGROUND OF THE INVENTION

In memory circuits a number of desirable characteristics, such as small chip size, reliability and speed may have detrimental effects on each other. In ROMs virtual ground techniques have been used to reduce chip size and improve speed. In a virtual ground system, two adjoining ROM cells share a source connection which is selectively switched to ground potential when one of the two ROM cells is selected. A characteristic of virtual ground systems, however, is a limitation on the voltage swing on the bit line. A bit line precharged to 4.0 volts, for example, may be allowed to drop to no lower than 3.0 volts in virtual ground system. The lower allowed limit is at least somewhat affected by the threshold voltage of the transistors used and word line voltage.

A maximum voltage swing of 1.0 volts is typically sufficient for reliable detection of the state of a selected cell because a typical cell has only two states. In reducing chip size by using four state cells instead of the typical two, the available 1.0 volt swing must be used to detect all four states. In such a case it becomes more important to preserve as much of the available voltage differential as possible. Voltage swing is also often minimized to increase speed as well. As the available voltage swing is reduced, the importance of preserving voltage differential for reliable sensing increases.

SUMMARY OF THE INVENTION

An object of the present invention is to provide an improved sensing technique in a memory.

Another object of the invention is to improve the reliability of sensing the state of a memory cell.

Yet another object of the invention is to reduce degradation of voltage differential in a memory.

These and other objects of the invention are achieved in a virtual ground memory in which a transistor memory cell is selected when a virtual ground line to which the selected memory cell is coupled is switched to a predetermined voltage level. The memory includes a first bit line, and first and second virtual ground lines which are both adjacent to the first bit line. A coupling circuit selectively couples the first bit line to a common line. A first transistor memory cell has a first terminal coupled to the first bit line, a second terminal coupled to the first virtual ground line, and a control terminal coupled to a word line. A load circuit is connected between the first bit line and the second virtual ground line for coupling current there between when the first virtual ground line switches to the predetermined voltage level.

DESCRIPTION OF THE INVENTION

Figures 1, 2:
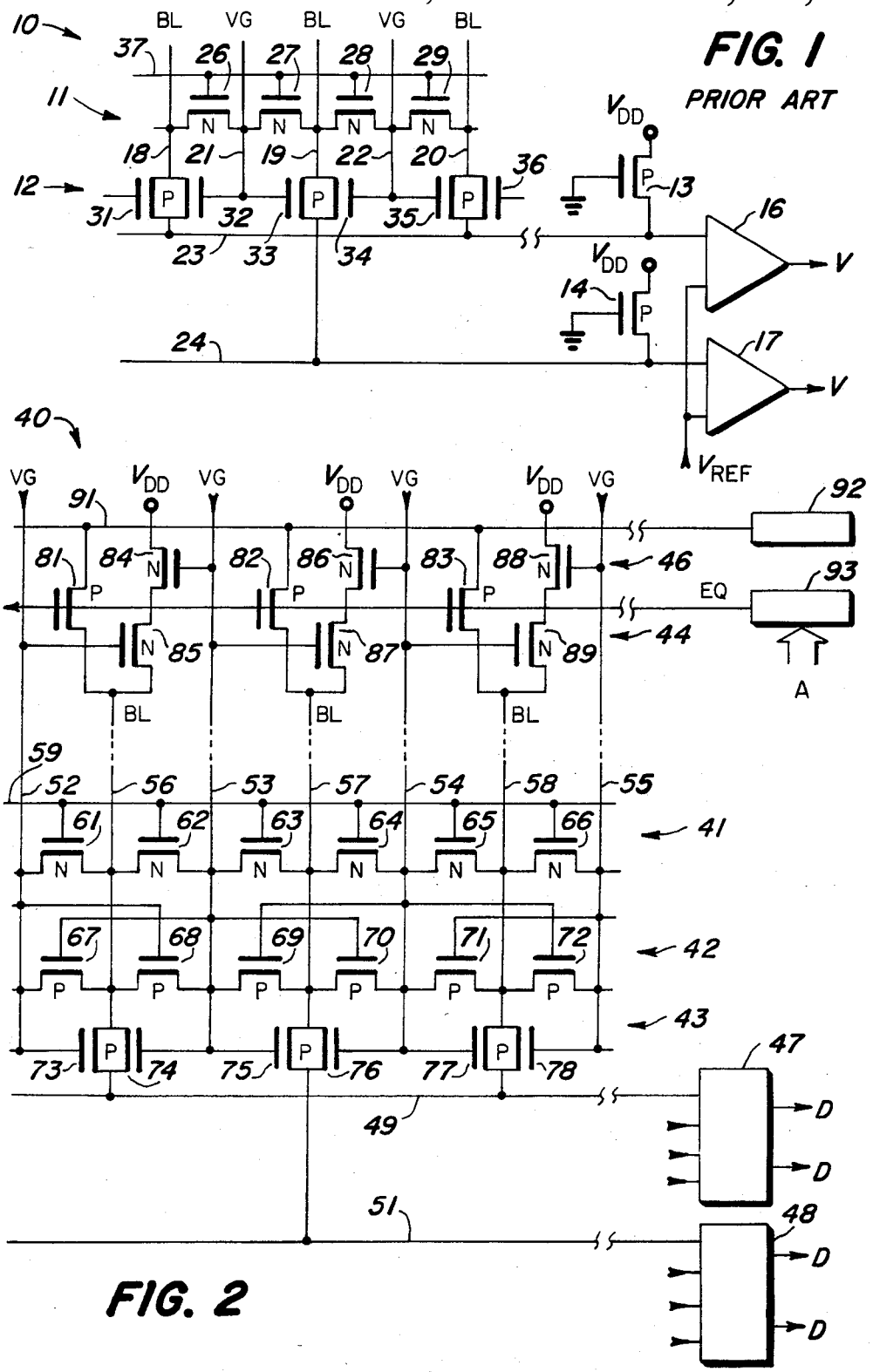
FIG. 1 is a schematic diagram of a portion of a memory according to the prior art.
FIG. 2 is a schematic diagram of a portion of a memory according to a preferred embodiment of the invention.

Shown in FIG. 1 is a portion of a memory 10 according to the prior art which will be described as an aid to understanding the invention. Memory 10 comprises a row of N channel transistor memory cells 11, a plurality of P channel coupling transistors 12, a P channel load transistor 13, a P channel load transistor 14, sense amplifier 16, a sense amplifier 17, a bit line 18, a bit line 19, a bit line 20, a virtual ground line 21, a virtual ground line 22, a common line 23, and a common line 24. All of the N channel transistors are N channel insulated gate field effect transistors having a threshold voltage of 0.5 to 0.7 volt. All of the P channel transistors are P channel insulated gate field effect transistors having a threshold voltage of $-0.5$ to $-0.7$ volt. Row 11 comprises a transistor 26, a transistor 27, a transistor 28, and a transistor 29. Plurality of P channel coupling transistors comprises a transistor 31, a transistor 32, a transistor 33, a transistor 34, a transistor 35, and a transistor 36.

Transistor 13 has a gate connected to ground, a source connected to a postive power supply terminal VDD for receiving a power supply voltage of, for example, 5 volts, and a drain connected to line 23. Transistor 14 has a gate connected to ground, a source connected to VDD, and a drain connected to line 24. Transistor 26 has a drain connected to bit line 18, a gate connected to a word line 37, and a source connected to virtual ground line 21. Transistor 27 has a drain connected to bit line 19, a gate connected to word line 37, and a source connected virtual ground line 21. Transistor 28 has a drain connected to bit line 19, a gate connected to word line 37, and a source connected to virtual ground line 22, transistor 29 has a drain connected to bit line 20, a gate connected to word line 37, and a source connected to virtual ground line 22. Transistors 31 and 32 each have a source conected to bit line 18, and a drain connected to common line 23. Transistor 31 has a gate connected to a virtual ground line (not shown). Amplifier 16 has a first input connected to common line 23, a second input for receiving a reference voltage VREF, and an output for providing a first output signal V1. Amplifier 17 has a first input connected to common line 24, a second input for receiving VREF, and an output for providing a second output signal V2. It is of course understood that memory 10 has additional rows of memory cells coupled to bit lines 18–20 as well additional bit lines which are not shown.

Operating as a virtual ground type of read only memory (ROM), cells 26–29 of memory 10 are programmed to a predetermined state. If cells 26–29 are two state cells, then by any conventional means cells 26–29 are programmed to either become conductive when word line 37 switches to a logic high or remain non-conductive even when word line 37 is a logic high. As an example, assume transistor 28 is programmed to become conductive and transistor 29 is programmed to remain non-conductive. When word line 37 switches to a logic high and virtual ground line 22 switches to ground potential, transistors 28 and 29 are selected. Transistor 28 becomes conductive while transistor 29 remains non-conductive. With virtual ground line 22 at ground potential transistors 34 and 35 become conductive, coupling bit lines 19 to common line 24 and bit line 20 to common line 23. Bit lines 19 and 20 would typically be precharged to some voltage near VDD, such as 4 volts. With transistor 29 not conducting, bit line 20 will not be reduced in voltage. In fact load transistor 13 will actually tend to increase the voltage on bit line 20 via common line 23 and transistor 35. Amplifier 16 can then easily detect that transistor 29 is non-conductive which is then reflected by the logic state of signal V1. It is purely a design choice whether a logic high is represented by a non-conductive or a conductive memory cell. The typical choice is a logic high being represented by a non-conductive cell.

Because transistor 28 is conducting, bit line 19 is reduced in voltage. As is characteristic of virtual ground designs, how far the voltage can be reduced on bit line 19 is limited and thereby predetermined by the fact that transistor 27 can become conductive due to the bilateral nature of insulated gate field effect transistors. With word line 37 at a logic high of, for example, 4.0 volts, transistor 27 will become conductive if bit line 19 drops sufficiently below 4.0 volts. Because virtual ground line 21 is at or near the voltage of VDD, if transistor 27 becomes conductive, transistor 27 will supply unwanted current onto bit line 19. Due to body effect, which is well known, the threshold voltage of transistor 27 increases to a voltage near 1.0 volt. Consequently, bit line 19 is limited to dropping to no lower than to about 3.0 volts. Transistor 28 then draws current supplied by load transistor 13. This current flows through common line 23 and transistor 34 as well as bit line 19. Commonly in ROMs as well as in other memories, bit lines are metal so the resistance of the bit lines such as bit line 19 is negligible. Most of the other conducting lines, such as common line 23, however, use polysilicon or diffusion tunnels. A tunnel is used to cross under a metal line. Although common line 23 is required to be substantially metal, it also has some tunnels. Minimizing such tunnels has been a serious consideration in laying out memories such as memory 10. Due to the tunnels along the distance that line 23 must traverse, the resistance of line 23 is not negligible. Additionally, transistor 13 has an "on" resistance. The cumulative effect of the resistance of line 23 and transistor 34 can result in a 0.2 volt drop between the drain of transistor 13 and bit line 19. Consequently, a 3.0 volt signal caused by a conducting ROM cell results in a 3.2 volt signal seen by amplifier 16. Consequently, there is a degradation of the noise margin from 1.0 volt to 0.8 volt.

Although this voltage drop between bit line and load causes a degradation of the noise margin, this deterioration has been easily overcome. The memory cells are programmed to provide one of either a 3.0 volt or a 4.0 volt signal. That the sense amplifier may actually receive a 3.2 volt signal still leaves at least a 0.8 volt differential between states. Obtaining a reference voltage for VREF which is certain to be between the voltages provided for the two states has been reliably achieved. Additionally, that the conductive state of a memory cell provides a voltage which varies with bit line location has not been a problem due to the large noise margin even in the worst case.

This voltage drop between load and selected bit line can be a problem, however, when the noise margin is small. A solution of course is simply to increase the noise margin. Increasing noise margin typically implies increasing voltage swing which typically implies reduced speed. In the case of a four state ROM cell which can be programmed to one of four states, from a most conductive to a least conductive state, there is inherently a more difficult sensing problem than for a two state cell. For example, assume that the first, second, third, and fourth states provide evenly spaced voltages over a one volt range of 3.0, 3.33, 3.67 and 4.0 volts, respectively. There is then only about 0.33 volt between states. If, however, the most conductive state provides a 3.2 volt signal, then the four cells, to be evenly spaced, should provide 3.2, 3.47, 3.73, and 4.0 volts. There is then a 20% reduction in noise margin between states by virtue of the voltage drop along line 23 in a situation where noise margin is already low.

One approach is to increase the voltage swing between the least and most conductive states. This is severely limited, however, by the virtual ground constraint of limiting how low a bit line can go, 3.0 volts in the example of FIG. 1. Virtual ground is typical in ROMs because it offers space saving and speed advantages. To not use virtual ground would tend to offset the space savings which accompany using four state cells.

Shown in FIG. 2 is a portion of a memory 40 according to a preferred embodiment of the present invention which substantially reduces the degradation of voltage differential due to current flow between a load and a selected bit line. Memory 40 comprises generally a row of N channel transistor memory cells 41, a plurality of P channel load transistors 42, a plurality of P channel coupling transistors 43, a plurality of P channel equalization transistors 44, a plurality of N channel pull-up transistors 46, a sense amplifier 47, a sense amplifier 48, a common line 49, a common line 51, a virtual ground line 52, a virtual ground line 53, a virtual ground line 54, a virtual ground line 55, a bit line 56, a bit line 57, a bit line 58, and a word line 59. Row of cells 41 comprises transistor 61, transistor 62, transistor 63, transistor 64, transistor 65, and transistor 66. Plurality of load transistors 42 comprises a transistor 67, a transistor 68, a transistor 69, a transistor 70, a transistor 71, and a transistor 72. Plurality of coupling transistors 43 comprises a transistor 73, a transistor 74, a transistor 75, a transistor 76, a transistor 77, and a transistor 78. Plurality of equalization transistors 44 comprises transistor 81, transistor 82, and transistor 83. Plurality of pull-up transistors 46 comprises transistor 84, transistor 85, transistor 86, transistor 87, transistor 88, and transistor 89.

Each of transistors 61–66 has a gate connected to word line 59. Transistor 61 has a source connected to virtual ground line 52, and a drain connected to bit line 56. Transistor 62 has a source connected to virtual ground line 53 and a drain connected to bit line 56. Transistor 63 has a source connected to virtual ground line 63, and a drain connected to bit line 57. Transistor 64 has a source connected to virtual ground line 54, and a drain connected to bit line 57. Transistor 65 a source connected to virtual ground line 54, and a drain connected to bit line 58. Transistor 66 has a source connected to virtual ground line 55, and a drain connected to bit line 58.

Each of transistors 67–72 has a gate connected to a virtual ground line, a source connected to a virtual ground line, and a drain connected to a bit line. Transistor 67 has a gate, a source, and a drain connected to lines 53, 52, and 56, respectively. Transistor 68 has a gate, a source, and a drain connected to lines 52, 53, and 56 respectively. Transistor 69 has a gate, a source, and a drain connected to lines 54, 53, and 57, respectively. Transistor 70 has a gate, a source, and a drain connected to lines 53, 54, and 57, respectively. Transistor 71 has a gate, a source, and a drain connected to lines 55, 54, and 58, respectively. Transistor 72 has a gate, a source, and a drain connected to lines 54, 55, and 58, respectively.

Transistors 73–78 each has a gate connected to a virtual ground line, a source connected to a bit line, and a drain connected to a common line. Transistor 73 has a gate, a source, and a drain connected to lines 52, 56, and 49, respectively. Transistor 74 has a gate, a source, and a drain conected to lines 53, 56, and 49, respectively. Transistor 75 has a gate, a source, and a drain connected to lines 53, 57, and 51, respectively. Transistor 76 has a gate, a source, and a drain connected to lines 54, 57, and 51, respectively. Transistor 77 has a gate, a source, and a drain connected to lines 54, 58, and 49, respectively. Transistor 78 has a gate, a source, and a drain connected to lines 55, 58, and 49, respectively.

Each of transistor 81–83 have a gate for receiving an equalization pulse EQ, a source connected to an equalization line 91, and a drain connected to a bit line. The drains of transistors 81–83 are connected to bit lines 56–58, respectively. A voltage generator 92 has an output connected to line 91 which provides a voltage of about one half of the voltage at $V_{DD}$ to line 91. This ½ $V_{DD}$ is intentionally provided at a high impedance. Equalization pulse EQ is generated in response to a transition of an address A by an equalization pulse generator 93. Of course it is well known that the memory cells are selected by an address. To change the selection, the address must change. This change in address, or address transition, causes an occurrence of pulse EQ. After each address transition all of the bit lines 56–58 are equalized. This is advantageous for improving access speed and for compensating for problems caused by changes in power supply voltage, known as power supply slew.

Transistor 84 has a drain connected to VDD, a gate connected to virtual ground line 53, and a source. Transistor 85 has a drain connected to the source of transistor 84, a gate connected to virtual ground line 52, and a source connected to bit line 56. Transistor 86 has a drain connected to VDD, a gate connected to virtual ground line 54, and a source. Transistor 87 has a drain connected to the source of transistor 87, a gate conected to virtual ground line 53, and a source connected to bit line 57. Transistor 88 has a drain connected to VDD, a gate connected to virtual ground line 55, and a source. Transistor 89 has a drain connected to the sourse of transistor 88, a gate connected to virtual ground lines 54, and a source connected to a bit line 58.

Amplifier 47 has a first input connected to common line 49, a second input for receiving a first reference voltage VR1, a third input for receiving a second reference voltage VR2, a fourth input for receiving a third reference voltage VR3, a first output for providing a data signal D0, and a second output for providing a data signal D1. Amplifier 48 has a first input conected to common line 51, a second input for receiving reference voltage VR1, a third input for receiving reference voltage VR2, a fourth input for receiving reference voltage VR3, a first output for providing a data signal D2, and a second output for providing a data signal D3.

Memory cells 61–66 are four state memory cells so that each cell represents two binary digits. Each sense amplifier 47 and 48 receives the output of one memory cell, determines to which of the four states the memory cell has been programmed, and provides two binary outputs which correspond to the programmed state. Reference voltages VR1, VR2, and VR3 are used by sense amplifiers 47 and 48 to determine the state of the selected memory cells. One way to generate reference voltages VR1, VR2, and VR3 is by using dummy cells (not shown) which have gains between those of the four program states. Each sense amplifier 47 and 48 may have its own dummy cells or may share them with each other.

As in memory 10 of FIG. 1 two memory cells are selected by one virtual ground line switching to ground potential. For example virtual ground line 53 switching to ground potential while word line 59 is a logic high will select transistors 62 and 63. Both transistors 62 and 63 become conductive. The extent of the conductivity is determined by the states to which memory cells 62 and 63 had been programmed. Virtual ground line 53 switching to a logic low causes transistors 74 and 75 to become conductive so that bit lines 56 and 57 are coupled to common lines 49 and 51, respectively. Load transistors 67 and 70 also become conductive in response to virtual ground line 53 switching to ground potential, whereas bit line pull-up transistors 84 and 87 become non-conductive. Virtual ground lines 52 and 54 remain at VDD so that transistors 67 and 70 act as loads for memory cells 62 and 63, respectively. Virtual ground line 55 also remains at VDD so that bit line 58 remains charged by transistors 88 and 89 remaining conductive. Sense amplifiers 47 and 48 respond to selected memory cells 62 and 63 being coupled to common lines 49 and 51 by providing data signals D0-D3 representative of the programmed state of memory cells 62 and 63.

Because plurality of load transistors 42 are connected to bit lines 56–58 which eliminates static load current through common lines 49 and 51, common lines 49 and 51 can have extensive tunnelling but not cause a voltage drop due to static current flow between load and selected memory cell. In the example described static current will flow from load transistor 70 to memory cell 63 via bit line 57 and from load transistor 67 to memory cell 62 via bit line 56. Bit lines, such as bit lines 56–58, are conveniently metal so that current flow therethrough causes only a negligible voltage drop. For each time a virtual ground line switches to a logic low, the two bit lines which are adjacent to the virtual ground line are selected and the load transistors associated with the selected bit lines are enabled. Each bit line has a virtual ground line adjacent to each of its two sides. When the bit line is selected, one of these adjacent virtual ground lines switches to ground while the other remains at or near the potential at VDD.

There is a load transistor connected between each of the virtual ground lines and the bit line. The load transistor between the bit line and the virtual ground line at or near the potential at VDD is enabled by the virtual ground line which is switched to ground potential. By taking advantage of the fact that a virtual ground line adjacent to a selected bit line remains at or near VDD provide a power supply for the load transistor, no extra power supply line is required. Consequently, although additional chip area is required for having load transistors connected to each bit line instead of just common lines, this additional chip area is not as great as it would have been by if each load transistor had its source connected to VDD.

With plurality of load transistors 42 connected to bit lines 56–58, the degradation of voltage differential between the voltage provided by a selected memory cell and a relevant reference is substantially reduced. As a virtual ground memory, memory 40 has the same limitation on how low a bit line voltage can go as that described for memory 10 of FIG. 1. Consequently, the voltage differential between the most conductive and least conductive cell is essentially fixed. Because the noise margins are made small by virtue of using four state cells, it is imperative to retain as much noise margin as is possible. Although common lines 49 and 51 have capacitance which is charged and discharged during operation so that some dynamic current flows through common lines 49 and 51, no static load flows through common lines 49 and 51 to degrade the voltage differential between the voltages present at the first inputs of amplifiers 47 and 48 and the relevant reference voltages VR1–VR3.

This load technique may also be useful in other circumstances in which it is important to avoid reducing noise margin.

I claim:

1. A virtual ground memory in which a transistor memory cell is selected when a virtual ground line to which the selected memory cell is coupled is switched to a predetermined voltage level, comprising:
    a first bit line;
    a first virtual ground line adjacent to the first bit line;
    a second virtual ground line adjacent to the first bit line;
    coupling means for selectively coupling the first bit line to a common line;
    a first transistor memory cell having a first terminal coupled to the first bit line, a second terminal coupled to the first virtual ground line, and a control terminal coupled to a word line; and
    load means connected between the first bit line and the second virtual ground line for coupling current therebetween when the first virtual ground line switches to the predetermined voltage level.

2. The memory of claim 1 wherein the load means causes a voltage drop between the first bit line and the second virtual ground line which is proportional to the current drawn therethrough.

3. The memory of claim 2 wherein the load means comprises a first load transistor having a first current electrode connected to the first bit line, a second current electrode coupled to the second virtual ground line, and a control electrode coupled to the first virtual ground line.

4. The memory of claim 3 wherein the first transistor memory cell is a four state ROM cell which can be programmed into any one of four states.

5. The memory of claim 1 further comprising:
    a first coupling transistor having a first current electrode coupled to the first bit line, a control electrode coupled to the first virtual ground line, and a second current electrode;
    a second coupling transistor having a first current electrode coupled to the second current electrode of the first coupling transistor, a control electrode coupled to the second virtual ground line, and a second current electrode coupled to a first power supply terminal.

6. The memory of claim 1 further comprising an equalization transistor having a first current electrode coupled to the first bit line, a control electrode for receiving an equalization pulse in response to an address transition, and a second current electrode coupled to an equalization line.

* * * * *